US011614497B2

(12) United States Patent
Doyle et al.

(10) Patent No.: US 11,614,497 B2
(45) Date of Patent: Mar. 28, 2023

(54) LEAKAGE CHARACTERIZATION FOR ELECTRONIC CIRCUIT TEMPERATURE MONITORING

(71) Applicant: International Business Machines Corporation, Armonk, NY (US)

(72) Inventors: Matthew Doyle, Chatfield, MN (US); James Busby, New Paltz, NY (US); Edward N. Cohen, Kingston, NY (US); John R. Dangler, Rochester, MN (US); Gerald Bartley, Rochester, MN (US); Michael Fisher, Poughkquag, NY (US); Arthur Higby, Cottekill, NY (US); David Clifford Long, Wappingers Falls, NY (US); Mark J. Jeanson, Rochester, MN (US); Darryl Becker, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 562 days.

(21) Appl. No.: 16/702,077

(22) Filed: Dec. 3, 2019

(65) Prior Publication Data

US 2021/0165051 A1    Jun. 3, 2021

(51) Int. Cl.
*G01R 31/52*       (2020.01)
*H05K 1/02*        (2006.01)
(Continued)

(52) U.S. Cl.
CPC .......... *G01R 31/52* (2020.01); *G01K 15/007* (2013.01); *G06F 30/30* (2020.01); *H02H 7/20* (2013.01);
(Continued)

(58) Field of Classification Search
CPC ........ G01R 31/52; G01K 15/007; G01K 3/06; G01K 2217/00; G01K 7/16; G06F 30/30;
(Continued)

(56) References Cited

U.S. PATENT DOCUMENTS 6,919,540 B2    7/2005  Kaastra
7,839,157 B2 *  11/2010 Hillman ............... H05K 1/0212
                                                    324/73.1
(Continued)

FOREIGN PATENT DOCUMENTS

CN    200950672 Y    9/2007
CN    101061076 A    10/2007
(Continued)

OTHER PUBLICATIONS

Doyle et al., "Leakage Characterization and Management for Electronic Circuit Enhancement," U.S. Appl. No. 16/702,160, filed Dec. 3, 2019.
(Continued)

*Primary Examiner* — Farhana A Hoque
(74) *Attorney, Agent, or Firm* — Scott S. Dobson

(57) ABSTRACT

An electronic system can be used to monitor temperature. The electronic system can include a characterized dielectric located adjacent to a plurality of heat-producing electronic devices. The electronic system can also include a leakage measurement circuit that is electrically connected to the characterized dielectric. The leakage measurement circuit can be configured to measure current leakage through the characterized dielectric. The leakage measurement circuit can also be configured to convert a leakage current measurement into a corresponding output voltage. A response device, electrically connected to the leakage measurement circuit can be configured to, in response to the output voltage
(Continued)

exceeding a voltage threshold corresponding to a known temperature, initiate a response action.

12 Claims, 4 Drawing Sheets

(51) Int. Cl.
*G06F 30/30* (2020.01)
*H05K 7/20* (2006.01)
*H05K 3/00* (2006.01)
*G01K 15/00* (2006.01)
*H02H 7/20* (2006.01)

(52) U.S. Cl.
CPC ......... *H05K 1/0201* (2013.01); *H05K 1/0277* (2013.01); *H05K 3/0005* (2013.01); *H05K 7/20209* (2013.01); *H05K 2201/012* (2013.01)

(58) Field of Classification Search
CPC ........ H02H 7/20; H02H 5/042; H05K 1/0201; H05K 1/0277; H05K 3/0005; H05K 7/20209; H05K 2201/012; H05K 2201/0191; H05K 1/0209; H05K 1/0268; H05K 2201/10204
USPC ......................................................... 324/509
See application file for complete search history.

(56) References Cited

U.S. PATENT DOCUMENTS

| | | | |
|---|---|---|---|
| 10,113,917 B2 * | 10/2018 | Suuronen | G01K 7/16 |
| 2008/0313576 A1 | 12/2008 | Kosowsky et al. | |
| 2011/0031981 A1 | 2/2011 | Tsujikawa | |
| 2016/0172311 A1 * | 6/2016 | Pagani | H01L 21/76224 324/762.01 |
| 2017/0086257 A1 | 3/2017 | Muehlnikel et al. | |

FOREIGN PATENT DOCUMENTS

| | | |
|---|---|---|
| CN | 201557323 U | 8/2010 |
| CN | 105459832 A | 4/2016 |
| CN | 105934660 A | 9/2016 |
| CN | 106993995 A | 8/2017 |
| CN | 108476557 A | 8/2018 |
| JP | 2014219488 A | 11/2014 |
| TW | 200941720 A | 10/2009 |
| WO | 02096155 A1 | 11/2002 |
| WO | 2010008279 A1 | 1/2010 |

OTHER PUBLICATIONS

International Search Report and Written Opinion, International Application No. PCT/IB2020/061137, dated Feb. 25, 2021, 10 pages.
First Office Action Notification, Application No. 202080083642.6, filed Nov. 25, 2020, 9 pgs., Feb. 7, 2023, IBM Docket P201903483CN01.

\* cited by examiner

Electronic System for Temperature Monitoring

LEAKAGE CHARACTERIZATION FOR ELECTRONIC CIRCUIT TEMPERATURE MONITORING

BACKGROUND

The present disclosure generally relates to an electronic system. In particular, this disclosure relates to an electronic system configured to self-monitor an operating temperature and react to an operating temperature above a temperature threshold.

A printed circuit board (PCB), can be used to mechanically support and electrically connect electronic components using conductive paths or signal traces etched from copper sheets laminated onto non-conductive dielectric substrates. Multiple copper/insulator layer pairs, also known as "cores," can be laminated together in the fabrication of the PCB. The number and arrangement of cores can be designed to fit the needs of a variety of applications.

Vertical interconnect structures (vias) can be used to interconnect conductive signal traces between various conductive layers within the PCB. Copper shapes or areas can be used for power and ground distribution to components mounted on the PCB. The interconnect structures in the PCB can be designed to be physically and electrically compatible with the components the PCB can be used to interconnect.

Flexible printed circuits, also referred as "flex circuits," or "flex cables," can be generally understood to be similar to a PCB that can bend. In practice, however, the set of design rules, e.g., conductor widths and spacings, used to design and fabricate flex circuits can vary significantly from design rules used in the design and fabrication of rigid or semi-rigid PCBs. In some applications, the conductors of a flex circuit can be fabricated using process such as photo imaging or laser imaging as the pattern definition method rather than "printing" processes.

A flexible printed circuit includes a metallic layer of traces, often copper, bonded to a dielectric layer such as polyimide. The thickness of the metal layer can range from very thin, e.g., less than 0.0001" to very thick, e.g., greater than 0.010", and the dielectric thickness can similarly vary in a range between 0.0005" and 0.010". An adhesive material or other types of bonding such as vapor deposition, can be used to bond the metal to the substrate. Because copper tends to readily oxidize in the presence of air, exposed copper surfaces are often covered with a protective layer. Gold or solder are common materials used for this purpose, due to their electrical conductivity and environmental durability. For non-contact or non-conductive areas a dielectric material can be used to protect the circuitry from oxidation or electrical shorting. Electrical leakage, i.e., current leakage, can occur through dielectric materials located between adjacent metallic layers.

SUMMARY

Embodiments can be directed towards an electronic system for temperature monitoring. The electronic system includes a characterized dielectric located adjacent to a plurality of heat-producing electronic devices and a leakage measurement circuit, electrically connected to the characterized dielectric. The leakage measurement circuit is configured to measure current leakage through the characterized dielectric and convert a leakage current measurement into a corresponding output voltage. The electronic system also includes a response device, electrically connected to the leakage measurement circuit. The response device is configured to, in response to the output voltage exceeding a voltage threshold corresponding to a known temperature, initiate an action.

Embodiments can also be directed towards a method for designing an electronic system for temperature monitoring. The method includes receiving design requirements for the electronic system and characterizing dielectric and adhesive materials that are candidates for use in the electronic system. The method further includes choosing, from candidate dielectric and adhesive materials, dielectric and adhesive materials in accordance with the design requirements. The method further includes designing a characterized dielectric to include chosen dielectric and adhesive materials and fabricating the characterized dielectric in accordance with a characterized dielectric design. The method further includes integrating the characterized dielectric into the electronic system by populating the electronic system with a plurality of heat-producing electronic devices and electrically interconnecting the characterized dielectric to a leakage measurement circuit.

Embodiments can also be directed towards a method for operating an electronic system for temperature monitoring. The method includes receiving, with a characterized dielectric, heat from adjacent heat-producing electronic devices and measuring, with a leakage measurement circuit, current leakage through the characterized dielectric. The method further includes converting, with the leakage measurement circuit, measured current leakage into a corresponding output voltage and comparing, with a response device electrically interconnected to the leakage measurement circuit, the corresponding output voltage to a high-voltage threshold. The comparing is done to detect a characterized dielectric temperature greater than a high-temperature threshold. The method further includes initiating, in response to the temperature of the characterized dielectric exceeding the high-temperature threshold, an action with the response device.

The above summary is not intended to describe each illustrated embodiment or every implementation of the present disclosure.

BRIEF DESCRIPTION OF THE DRAWINGS

The drawings included in the present application are incorporated into, and form part of the specification. They illustrate embodiments of the present disclosure and, along with the description, serve to explain the principles of the disclosure. The drawings are only illustrative of certain embodiments and do not limit the disclosure.

Figure 1:
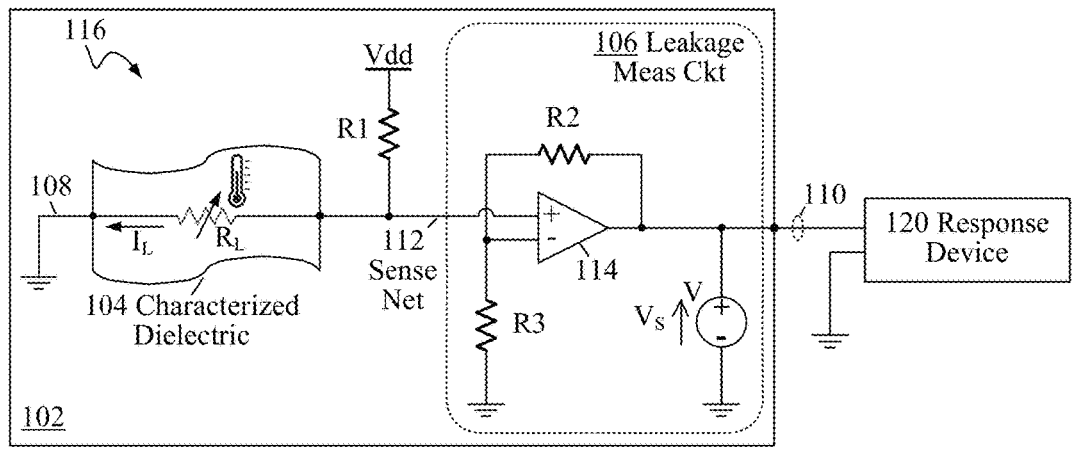
FIG. 1 depicts an electronic system for temperature monitoring, according to embodiments of the present disclosure.
Figure 1:
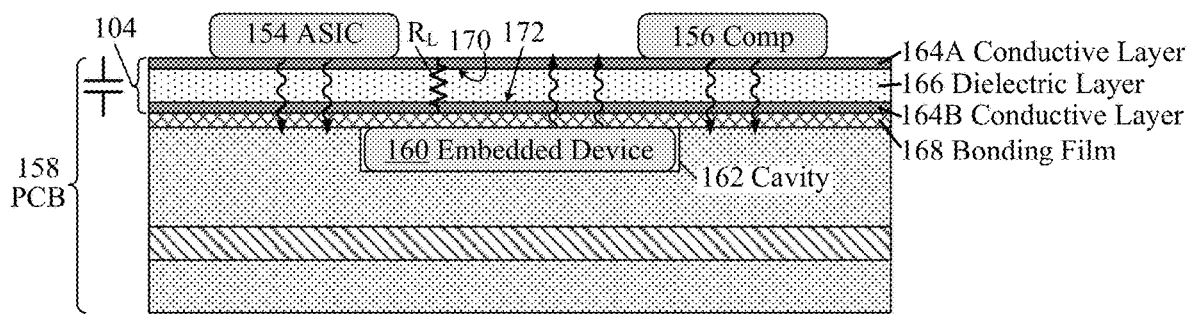

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

Certain embodiments of the present disclosure can be appreciated in the context of providing temperature monitoring, through a leakage measurement circuit, for electronic equipment such as servers, which may be used to provide data to clients attached to a server through a network. Such servers may include, but are not limited to web servers, application servers, mail servers, and virtual servers. While not necessarily limited thereto, embodiments discussed in this context can facilitate an understanding of various aspects of the disclosure. Certain embodiments may also be directed towards other equipment and associated applications, such as providing temperature monitoring, through a leakage measurement circuit, for computing systems, which may be used in a wide variety of computational and data processing applications. Such computing systems may include, but are not limited to, supercomputers, high-performance computing (HPC) systems, and other types of special-purpose computers. Embodiments may also be directed towards providing temperature monitoring, through a leakage measurement circuit, for consumer and small office/home office (SOHO) electronic equipment such as personal computers, laptops, mobile and network server devices.

For ease of discussion, the term "FR" is used herein, in reference to a class of Fire Retardant glass fiber epoxy laminate materials. FR materials, particularly FR4, are commonly used in the construction of a wide variety of PCBs. FR4 is designed for use in high-density multi-layer printed circuit boards (PCBs) and is suitable for high volume fine-line/multi-layer applications.

Similarly, the term "AP" is generally used herein, in reference to a class of Adhesive-less/high-Performance laminate materials that include a copper-clad laminate and an all-polyimide composite of polyimide film bonded to copper foil. Such materials can be used in constructing multilayer flex and rigid flex applications which require advanced material performance, temperature resistance and high-reliability.

The term "HT" is generally used herein, in reference to a class of High Temperature laminate materials that feature favorable material and electrical characteristics. Such materials can have a higher glass transition temperature ($T_g$) and lower loss characteristics (e.g., loss tangent) than materials such as FR4.

Increasing power dissipation and internal temperatures of electronic systems such as computers, supercomputers, servers, network and telecom equipment and the like have been continuing, long-term industry trends. Internal operating temperatures that exceed specified limits can pose serious risks to electronic system components such as PCBs, integrated circuits (ICs) and power supply units. A PCB, for example, operating at a temperature approaching $T_g$ can experience a change of material state, delaminate, outgas, and/or lose mechanical/structural integrity.

In order to mitigate the risk of thermal-related electronic system failures, which can be catastrophic to both electronic hardware as well as to data integrity, improved system cooling and temperature monitoring features can be implemented. Such temperature monitoring systems can use discrete temperature sensing devices that monitor temperature at a single point within the electronic system. In response to a sensed "over-temperature" condition, a variety of corrective actions can be initiated in order to restore the operating temperature of the system within a specified and safe range.

Such "single-point" or even "multiple-point" temperature monitoring systems, however, can easily produce inaccurate electronic system temperature measurements. A discrete temperature sensor can produce an inaccurate reading resulting from the temperature at the sensor location not correlating to the overall or average temperature of the electronic system. For example, a discrete sensor can be located in a relatively cool location of the system, e.g., near a cooling air intake vent, or it can be located adjacent to an electronic device having a relatively high thermal output such as a processor. In either scenario, the discrete sensor may provide inaccurate temperature measurements, which can cause any corresponding response action to be initiated too frequently, or not frequently enough. Either of these scenarios can be detrimental to performance and reliability of the electronic system.

Embodiments of the present disclosure are directed towards a temperature monitoring system for an electronic system such as a computer, supercomputer, server, and the like. The temperature monitoring system includes a characterized dielectric that serves as a temperature-dependent resistor, and that is integrated into a PCB or flexible circuit. The integration of the characterized dielectric into a PCB or flexible circuit allows it to receive heat from a number of heat-producing electronic devices within the electronic system, and not simply from a single or small number of heat-producing electronic devices. The physical size of the host PCB or flexible circuit ensures that the characterized dielectric does not act a discrete or "point" temperature sensor, thus eliminating that problems associated with such sensors, as described above. A leakage measurement circuit is used to convert a characterized dielectric leakage current into a voltage proportional to a temperature of the characterized dielectric. An electrically interconnected response device is used to initiate corrective actions in response to one or more temperature thresholds being crossed.

Various aspects of the present disclosure can be useful for sensing and monitoring electronic system temperature changes without using individual/discrete external temperature sensors. An electronic system configured according to embodiments may sense, with one sensor, an overall electronic system operating temperature more accurately than a system configured with one or more discrete temperature sensors.

Embodiments can be configured to respond to violations of one or more operating temperature threshold(s) by initiating actions designed to mitigate a variety of temperature-related conditions. Such conditions can include "over-temperature" conditions corresponding to temperatures approaching a $T_g$ temperature at which PCB resins change state, begin to outgas, discolor, delaminate and/or lose structural integrity. A PCB approaching $T_g$ can also experience a change in electrical properties. By way of example, a $T_g$ for FR4 dielectric materials can be approximately 130° C.-140° C. "Over-temperature" conditions can also include approaching a PCB ignition temperature.

Embodiments of the present disclosure can be useful in managing electronic system design cost and complexity while using existing and proven PCB design methodologies and material sets. Embodiments of the present disclosure can be used to detect temperatures, either above or below preset temperature thresholds resulting from certain data security and cryptography-related tampering events. Such events can include low-temperature or high-temperature events. Embodiments can provide a non-mechanical, e.g., not bi-metallic, temperature sensor having no mechanical movement or deviation for use within electronic systems. Such a sensor can have enhanced reliability relative to other types of temperature sensing devices. Some embodiments of the present disclosure can be useful in extremely cold, i.e., cryogenic or space environments. Aspects of the various embodiments can be used to monitor PCB product quality by detecting temperature values experienced by a PCB or flexible circuit during raw card manufacturing process.

An electronic system designed according to certain embodiments can be compatible with existing and proven computer, server, supercomputer and personal computer (PC) designs and PCB/flexible circuit design methodologies and material sets. A electronic temperature monitoring system constructed according to embodiments of the present disclosure can be installed within an existing electronic equipment enclosure.

Certain embodiments relate to an electronic system configured to self-monitor an operating temperature and react when the operating temperature is above or below a preset temperature threshold. FIG. 1 includes consistent views 100 and 150 of an electronic system 102 for temperature monitoring, according to embodiments of the present disclosure. View 100 can provide a visual understanding of electronic system 102 that includes a characterized dielectric 104 and an electrically interconnected leakage measurement circuit 106 configured to monitor the temperature of characterized dielectric 104. In response to a sensed temperature of characterized dielectric 104 that is above or below a specified threshold, a response device 120 can initiate an action designed to mitigate a thermal issue/condition within the electronic system 102. It can be understood that electronic system 102 can be integrated into a wide variety of electronic devices and systems such as computers, special-purpose computers and servers, as detailed above. Such systems can rely on the monitoring of internal operating temperatures in order to ensure operation within a specified safe operating temperature range.

While a particular component arrangement and interconnection scheme is depicted in views 100, 150, a number of variations of these schemes are possible that include the components depicted and described herein. Embodiments can be useful in providing accurate sensing of, and a timely response to high-temperature operating conditions for an electronic system. Such sensing and timely response can be particularly useful in preventing thermally-induced damage to hardware such as PCBs and electronic components, and preserving the integrity of data stored on the electronic system.

According to embodiments, characterized dielectric 104 has electrical properties that cause it to function as a temperature-dependent resistor $R_L$. For example, in embodiments, an increased temperature of characterized dielectric 104 can cause current leakage through it to increase, i.e., decrease the resistance of $R_L$. Conversely, a decrease in characterized dielectric 104 temperature can cause current leakage through it to decrease, i.e., increase the resistance of $R_L$. This temperature-dependent property of characterized dielectric 104 can make it particularly useful as a reliable and predictable temperature-sensing device. The resistance $R_L$ can be sensed and used as an indicator of the temperature of characterized dielectric 104.

In embodiments, characterized dielectric 104 includes dielectric material(s) located between, and in electrically conductive contact with two conductive layers, which serve as electrical terminals. According to embodiments, the two electrically conductive layers can each be a planar structure, such as a power plane of a PCB or flexible circuit. According to embodiments, characterized dielectric 104 can be a portion of a PCB, e.g., 158, view 150 that is located adjacent to multiple heat-producing electronic devices, e.g., 154, 156, 160, view 150, within electronic system 102. Similarly, in some embodiments, characterized dielectric 104 can represent a portion of a flexible circuit (not depicted), located adjacent to multiple heat-producing electronic devices.

The above-described placement of characterized dielectric 104 can allow it to receive heat from multiple heat-producing electronic devices, and thus provide a relatively accurate and "broad" indication of the temperature of the electronic system. Such an indication can be more accurate than a temperature indication from a discrete temperature sensor that can be located, for example, adjacent to a single component with a particularly high thermal output, e.g., a processor, which could provide an inaccurate, e.g., artificially high temperature indication.

Resistance $R_L$ of characterized dielectric 104 is part of voltage divider circuit 116, which also includes resistor R1 (electrically connected to $V_{DD}$), sense net 112 and GND net 108. When interconnected in such a circuit, the temperature-dependent value of $R_L$ can be determined by measuring, with leakage measurement circuit 106, a voltage, on sense net 112, produced by current leakage $I_L$ flowing through resistor $R_L$. This sensing can be used to provide repeatable voltages corresponding to specific operating temperatures of electronic system 102. The voltage at sense net 112 is subsequently amplified by leakage measurement circuit 106, in order to produce output voltage Vs at temperature output 110.

According to embodiments, leakage measurement circuit 106 can include an amplifier 114, which, in some embodiments, can be implemented as an operational amplifier (op-amp). In such an implementation, the gain of amplifier 114 can be determined by the ratio of the values of resistor R2 and resistor R3. Leakage measurement circuit 106 is depicted as an example circuit; other types of leakage measurement circuits 106 are possible. In embodiments, the functionality of leakage measurement circuit 106 can be relatively simple to implement as discrete components or into an existing or new IC such as an application-specific integrated circuit (ASIC). Embodiments can include other types and arrangements of electronic components used to implement leakage measurement circuit 106. In some embodiments, threshold detection circuitry/functionality can be designed into leakage measurement circuit 106.

In some embodiments, temperature output 110 can be a single analog signal wire. In some embodiments, leakage measurement circuit 106 can include additional components, not depicted, configured to convert output voltage Vs into other type of signal(s), for example, a digital and/or high-speed serial signal representing output voltage Vs. In corresponding embodiments, temperature output 110 can, for example, including conductors configured to transmit a representation of Vs as a high-speed serial signal such as a Universal Serial Bus (USB) signal.

Response device 120 is electrically connected to the leakage measurement circuit 106 through temperature output 110 to receive output voltage Vs. According to embodiments, response device 120 can include, but is not limited to, a processor circuit, a service processor, and a network-connected device. In some embodiments, response device 120 is configured to, in response to the output voltage exceeding a voltage threshold corresponding to a known high-temperature threshold of characterized dielectric 104, initiate an action. According to embodiments, the action can include, but is not limited to, reducing a clock frequency of a heat-producing electronic component within the electronic system 102, reducing power supplied to the electronic system 102, increasing cooling of the electronic system 102 and disconnecting a power source from the electronic system 102. In embodiments, actions can also include sending a message, e.g., text message, system console message or Short Messaging Service (SMS) message alerting a system user or technician of a temperature above or below a specified threshold. Actions can also include sounding an audible alarm or illuminating a visual indicator such as a light-emitting diode (LED). One or a combination of the above-described actions can be useful for protecting both the hardware of an electronic system and the integrity and security of data contained therein.

The employment of characterized dielectric 104 as a temperature sensor within PCB 158 can be particularly useful with respect to protecting PCB 158 from damage due to excessively high temperatures. The temperature of PCB 158 that is directly sensed and responded to can be significantly more accurate than temperature indications from discrete sensors which may not be directly correlated to a PCB 158 temperature. This direct sensing can be useful for providing an enhanced level of protection for PCB 158. In some embodiments, a violation of either a high-voltage or low-voltage threshold, corresponding to a high or low temperature, respectively, characterized dielectric 104 temperature can result from tampering activity related to a data security device. According to embodiments, a variety of actions, e.g., alert messages or alarms, and modification of hardware operation can be initiated based on a corresponding variety of high and low temperature thresholds being crossed.

According to embodiments, electronic system cross-sectional side view 150 can be useful in providing a visual understanding of a portion of electronic system 102. The electrical characteristics, structure and function of characterized dielectric 104 are consistent with those described above in reference to electronic system 102. View 150 can be particularly useful in depicting structural and thermal relationships between heat-producing electronic devices, e.g., ASIC 154 and component 156, characterized dielectric 104 and PCB 158.

According to embodiments, PCB 158 can be an integral part of a computer, supercomputer, server, PC, or other electronic system. PCB 158 includes characterized dielectric 104 and can also include heat-producing electronic devices such as ASIC 154 and component 156, mounted on at least one PCB or flexible circuit surface, and embedded device 160 mounted within a cavity 162. These devices can include a variety of component types including, but not limited to processors, memory ICs, graphics processing units (GPUs), Peripheral Component Interconnect Express (PCIe) switches and the like, consistent with ICs used in computers, servers, and other electronic systems. Power plane pairs, i.e., a core such as characterized dielectric 104 that includes dielectric layer 166 and associated adhesive materials, can be selected and included within a PCB 158 cross-section. In embodiments, a dielectric layer, e.g., 166, can be chosen by a designer, based on material characterization data, in order to conform to electronic system design requirements.

Characterized dielectric 104 can be located in close proximity to heat-producing electronic devices such as 154, 156, to ensure that temperatures measured through the use of characterized dielectric 104 closely correspond to heat dissipated by multiple heat-producing electronic devices. Characterized dielectric 104 can be particularly useful as a "broad" temperature sensing device that can provide accurate electronic system temperature measurements without being disproportionately influenced by one particular heat-producing electronic device. Characterized dielectric 104 is also useful in simultaneously providing power and ground distribution to electronic devices within electronic system 102. The use of characterized dielectric 104 can be helpful in managing and containing development and manufacturing costs, design and fabrication complexity and area needs for PCBs within an electronic system.

Example dielectric material types that can be used in characterized dielectric 104 can include, but are not limited to Fire Retardant (FR), High Temperature (HT) and Adhesive-less/high-Performance (AP) laminate materials layers. Conductive layers 164A and 164B, for example, can be partial or full conductive planes or wiring traces used to deliver power to various components mounted on surfaces of PCB 158. In accordance with PCB designs and material sets, conductive layers 164A and 164B can include copper and/or other types of metal.

According to embodiments, characterized dielectric 104 includes a dielectric layer 166 of a PCB 158, with a face 170 of the dielectric layer 166 adjacent to a conductive layer 164A of the PCB 158 and with an opposing face 172 of the dielectric layer 166 adjacent to a conductive layer 164B of the PCB 158. In some embodiments, characterized dielectric 104 can be employed as a single plane-pair, as depicted, or incorporated into a differential sensor that includes two or more plane pairs. In embodiments, bonding film 168 can be used to bond characterized dielectric 104 to another portion, for example other core layers, of PCB 158.

Reference 158 is depicted in view 150 as a PCB, however, in some embodiments, 158 can alternately represent a flexible circuit which, for example, can be used a point-to-point interconnection cable. In some embodiments, such a flexible circuit can include components mounted onto one or more surfaces. According to embodiments, such a flexible circuit can be located adjacent to a number of heat-producing electronic devices such as ASIC 154 and component 156.

FIG. 1 and the components depicted in FIG. 1 are not necessarily representative of the actual size of the components or subcomponents individually or collectively used in embodiments. They are not necessarily a representation of the actual or relative size of any device, component or subcomponent. Rather, they are meant to depict how each sub-component of an electronic system can be arranged relative to other sub-components in accordance with embodiments of the present disclosure.

Figure 2:
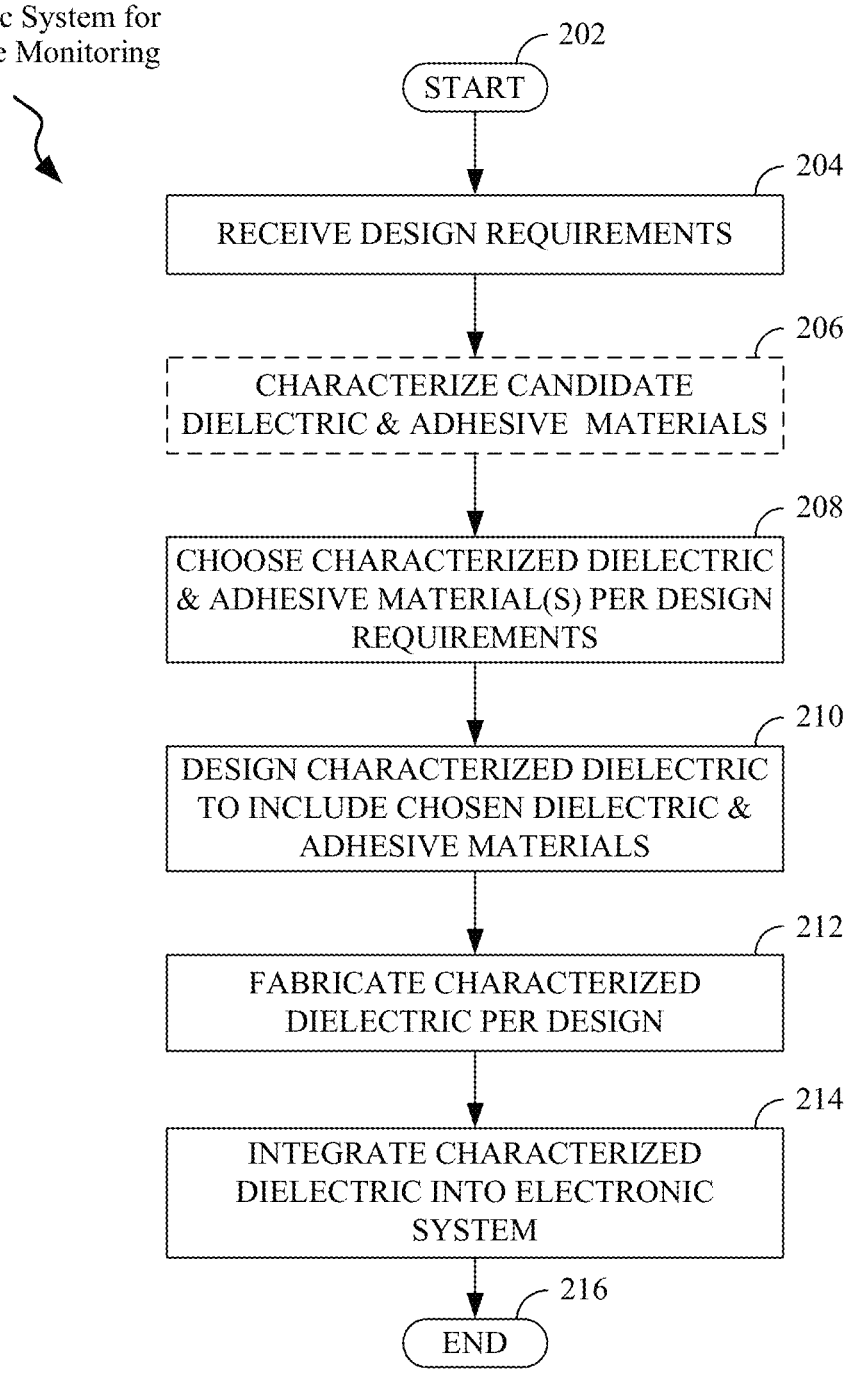
FIG. 2 is a flow diagram depicting a method for designing an electronic system for temperature monitoring, according to embodiments consistent with the figures.

FIG. 2 is a flow diagram depicting a method 200 for designing an electronic system 102, FIG. 1, for temperature monitoring, according to embodiments consistent with the figures. The execution of method 200 can be useful in designing an electronic system that can provide reliable, cost-effective temperature monitoring and corrective action responses for use with electronic systems such as computers and servers. In association with a functioning electronic system, method 200 can provide robust temperature monitoring and protection responses to the electronic system.

The method 200 moves from start 202 to operation 204. Operation 204 generally refers to receiving design requirements for the electronic system 102, FIG. 1, for temperature monitoring. According to embodiments, design requirements can include, for example, specified leakage characteristics of the characterized dielectric 104, FIG. 1, over a range of electronic system operating temperatures and a specified impedance range, across the conductive layers, e.g., 164A, 164B, of characterized dielectric 104, FIG. 1. Other design requirements can include, for example, specified maximum voltage droop and energy loss across the conductive layers of dielectric 104. According to embodiments, each of these requirements may need to be satisfied in order to meet the overall design requirements for an electronic system.

According to embodiments, the design requirements can be received by a circuit designer or electronic design automation (EDA) system from a specification document or file. Such a document or file can have, for example, the form of a printed copy or electronic file. The electronic file can have a variety of formats such as a word processing document, text file, spreadsheet file or a proprietary or non-proprietary specifications file.

It can be understood that various electronic systems can have a variety of different design requirements. For example, one type of electronic system may be portable and/or depend at least partially on battery power and may require a relatively small maximum dielectric leakage. In contrast, another type of electronic system may not depend on battery power, may have certain characteristics that are more compatible with a particular leakage measurement circuit 106 design, and have a characterized dielectric 104 with a larger specified maximum dielectric leakage. Once the design requirements have been received, the method 200 moves to operation 206.

Figure 3:
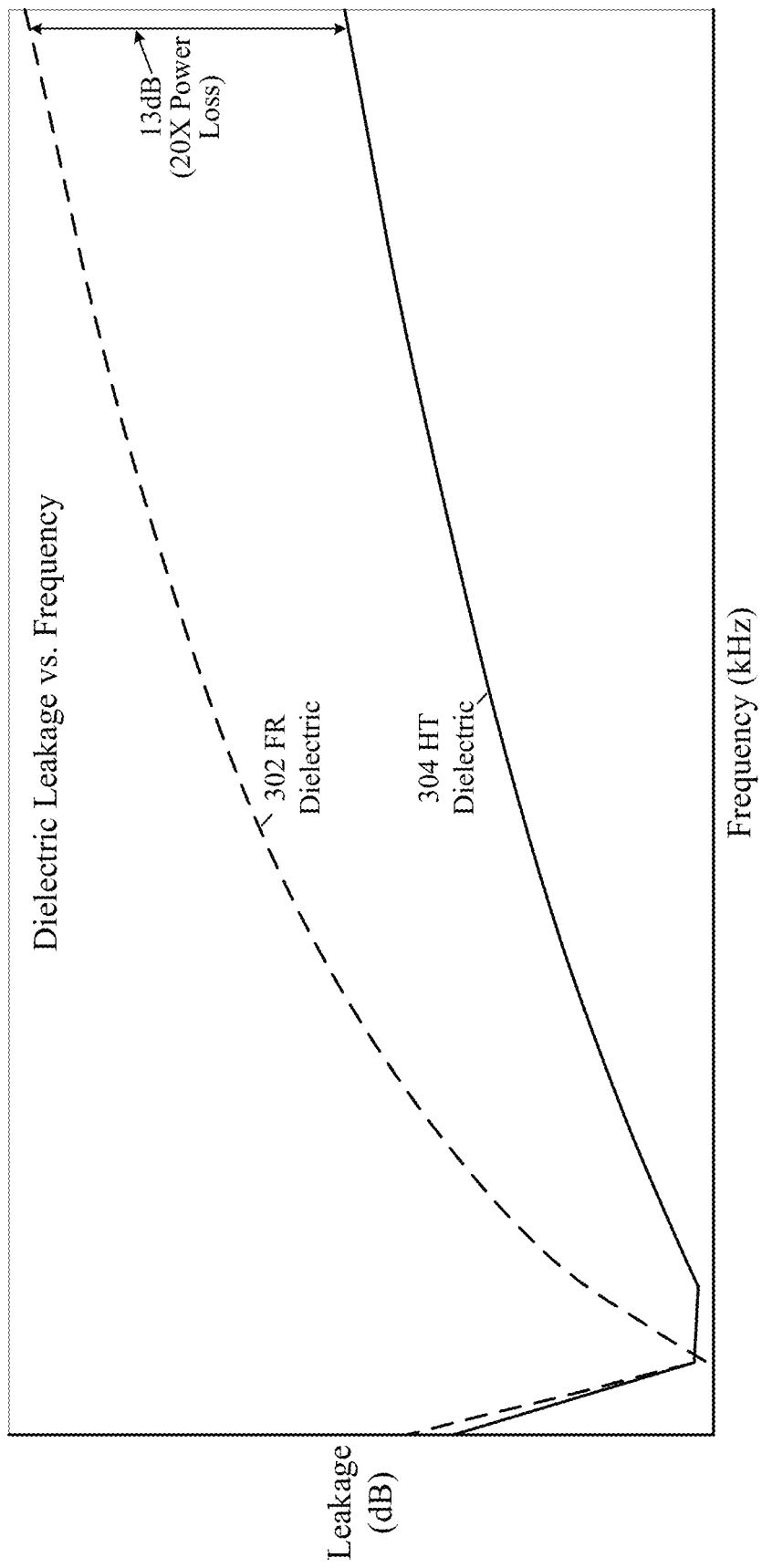
FIG. 3 includes a graph depicting dielectric leakage measurements for two dielectric materials, according to embodiments consistent with the figures.

Optional operation 206 generally refers to characterizing candidate dielectric and adhesive materials for use within the electronic system 100, 150, FIG. 1. According to embodiments, candidate dielectric and adhesive materials can be characterized in order to provide PCB and circuit designers with parameters that are useful in making design decisions and tradeoffs. For example, a dielectric material can be subjected to various frequencies applied to conductive plates on planar surfaces of the material, and resulting loss can be recorded. FIG. 3 is an example graph including plots of measured loss vs. frequency for two dielectric materials FR and HT. According to embodiments, characterizing candidate dielectric and adhesive can include characterizing electrical leakage properties, including temperature-dependant electrical leakage variation, of the candidate dielectric and adhesive materials. In embodiments, candidate dielectric and adhesive materials can include, but are not limited to, FR, HT and AP materials.

The above-described characterization can be performed by a vendor or supplier of dielectric materials, by a circuit or PCB designer, or by an independent lab, for example. Such characterization can be performed at one or more temperatures of interest, such as an anticipated maximum operating temperature, or across an operating temperature range of an electronic system. Once candidate dielectric and adhesive materials have been characterized, the method 200 moves to operation 208.

Operation 208 generally refers to choosing characterized dielectric and adhesive materials in accordance with the design requirements received in operation 204. According to embodiments, dielectric and adhesive materials are chosen, by a designer, from a number of characterized dielectric and adhesive materials, for example, FR, HT, and AP dielectric materials. In some embodiments, a dielectric material and a supplemental dielectric material can be combined in order to take advantages of the electrical and/or physical properties of both materials. One or more dielectric material can be chosen, based on variety of properties individual materials and properties of proportionally combined materials. These properties can include, for example, temperature-dependent leakage and loss characteristics, dielectric constant and adhesion properties. Choices of dielectric materials can be made in conjunction with analysis of output from EDA program such as a field-solver or other electrical simulation program. Once the characterized dielectric and adhesive materials have been chosen, the method 200 moves to operation 210.

Operation 210 generally refers to designing a characterized dielectric to include characterized dielectric and adhesive materials chosen in operation 208. According to embodiments, designing a characterized dielectric can include selecting a particular plane pair in a PCB or flexible circuit design and selecting a volume of characterized dielectric material that satisfies dielectric leakage design requirements. In some embodiments, more than one plane pair can be used, and in some embodiments, an EDA program such as a field-solver or other type of electrical simulation program can be used in the design process. Once the characterized dielectric has been designed, the method 200 moves to operation 212.

Operation 212 generally refers to fabricating a characterized dielectric in accordance with the characterized dielectric design completed in operation 210. According to embodiments, the characterized dielectric 104, FIG. 1, can be fabricated in accordance with the design of operation 210, and subsequently bonded, for example, with bonding film 168, FIG. 1, to other layers of the PCB 158, FIG. 1. Various lamination, etching, drilling, and other process steps used in operation 212 are generally consistent with existing PCB and/or flexible circuit fabrication and assembly processes. Once the characterized dielectric has been fabricated, the method 200 moves to operation 214.

Operation 214 generally refers to integrating the characterized dielectric, e.g., 104, FIG. 1, into the electronic system 102, FIG. 1. According to embodiments, the integrating can include populating the electronic system 102 with a plurality of heat-producing electronic devices, electrically interconnecting the characterized dielectric 104, FIG. 1, to the leakage measurement circuit 106, FIG. 1. In some embodiments, integrating can also include locating a flexible circuit 104 adjacent to the plurality of heat-producing electronic devices. Once the characterized dielectric has been integrated into the electronic system, the method 200 may end at operation 216.

FIG. 3 is a graph depicting dielectric leakage measurements as a function of frequency of two dielectric materials, according to embodiments consistent with the figures. Such dielectric materials can be used in layers, e.g., dielectric layer 166, FIG. 1, as may be included in a characterized dielectric 104. Characterization can include a wide variety of such dielectric materials including, but not limited to FR, HT and AP dielectric layers.

Characterization & measurement of characteristics such as dielectric leakage can give a PCB designer valuable insight regarding which dielectric materials or dielectric material combination(s) to choose for a particular application. The temperature-dependent electrical leakage of such dielectric materials can be useful in the measurement of temperatures within an electronic system, e.g., 102, FIG. 1.

The data plots provided in FIG. 3 can provide a visual understanding of causal relationships between measurement frequency and dielectric leakage, as well as the relative difference(s) in leakage between various types of dielectric materials. The vertical axis of FIG. 3 corresponds to the leakage, measured in dB, of FR and HT type dielectric materials; a higher value or location on the vertical axis corresponds to a higher leakage value. The horizontal axis at the bottom of FIG. 3 corresponds to a frequency (kHz) at which the leakage measurement is taken. By way of example, a range for the vertical axis can span from approximately −92 dB, at the bottom, to −70 db, at the top. Similarly, a range for the horizontal axis can span from approximately 0 kHz to 1.0 kHz. Leakage measurements can be taken at a variety of temperatures, such as 25° C., 85° C. or 100° C.

It can be observed that the FR dielectric curve 302 and the HT dielectric curve 304 have appreciably different leakages. For example, at the maximum measurement frequency, (right side of FIG. 4) the leakage difference shown between FR dielectric curve 302 and the HT dielectric curve 304 is approximately 13 dB, corresponding to a 20× difference in power loss between the FR and HT dielectric materials. Measurements for other dielectric material types can yield other relative results. Characterization of dielectric material characteristics such as leakage, as presented in FIG. 3, can be particularly useful for providing an understanding of the electrical characteristics of various dielectric material types, which can be used in choosing between dielectric material types to include in a characterized dielectric 104 design.

Figure 4:
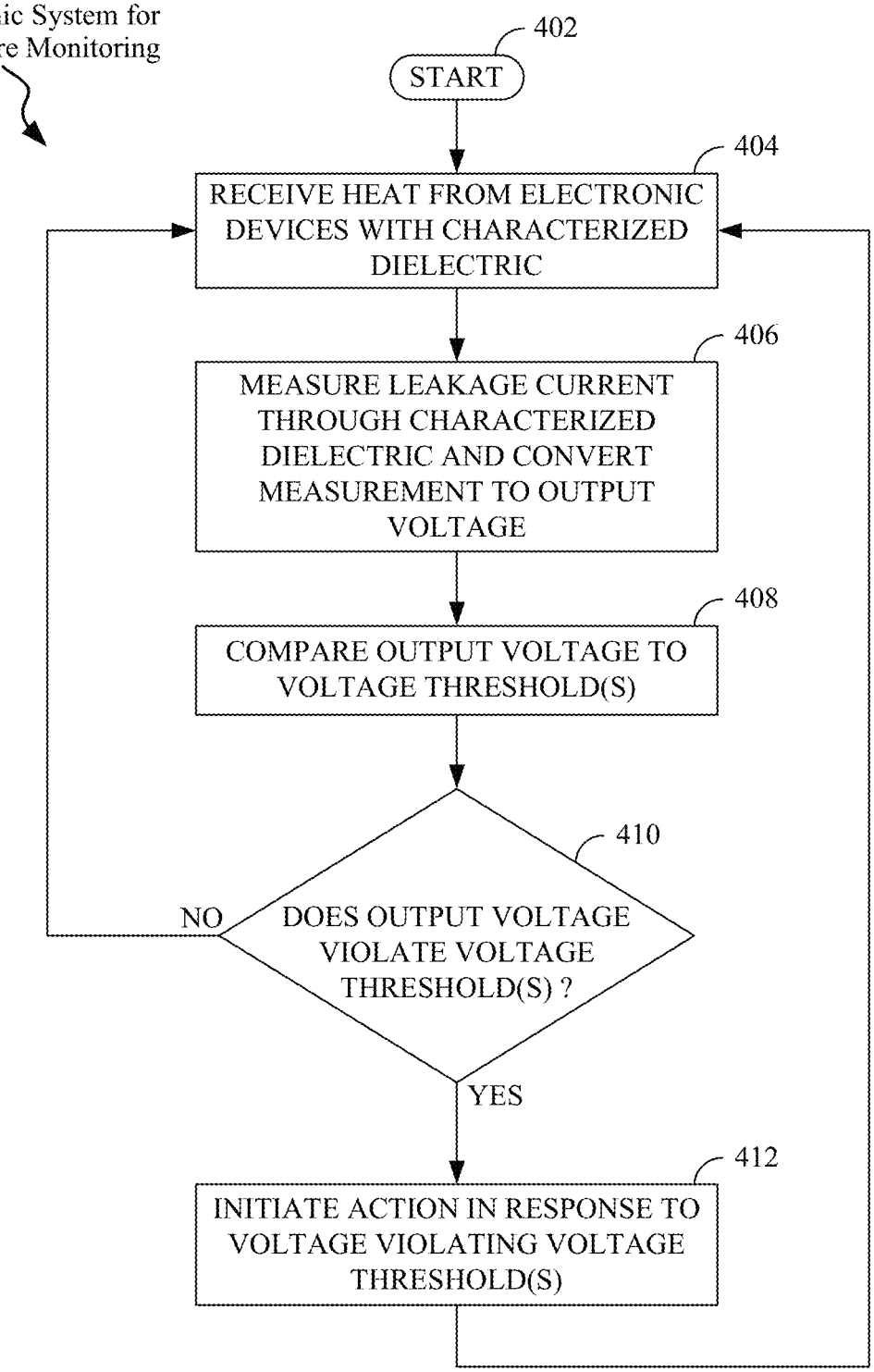
FIG. 4 is a flow diagram depicting a method for operating an electronic system for temperature monitoring, according to embodiments consistent with the figures.

FIG. 4 is a flow diagram depicting a method 400 for operating an electronic system 102, FIG. 1, for temperature monitoring, according to embodiments consistent with the figures. The execution of method 400 can be useful in providing self-monitoring of an electronic system operating temperature and in reacting to the operating temperature being above or below a temperature threshold. Method 400 can be executed without the need for discrete temperature sensors, IC temperature sensors or remote monitoring devices. When used in conjunction with a functioning electronic system, method 400 can provide robust, accurate operating temperature monitoring and protection response actions to the electronic system.

The method 400 moves from start 402 to operation 404. Operation 404 generally refers to receiving heat with characterized dielectric 104 from heat-producing electronic devices within electronic system 102. According to embodiments, heat dissipated by heat-producing electronic devices such as ASIC 154, component 156 and embedded device 160, FIG. 1, is received by a characterized dielectric 104 in close proximity, i.e., adjacent or in thermally conductive contact with the heat-producing electronic devices. According to embodiments, the temperature-dependent resistance of characterized dielectric 104 can change in response to a temperature change.

In some embodiments, the heat-producing electronic devices can be parts of an electronic system 102 that is a cryptography security system including a cryptography module. Cryptographic modules can include but are not limited to a cryptographic coprocessor, a cryptographic accelerator, a cryptographic adapter card, a cryptographic field programmable gate array (FPGA) and memory storing cryptographic accelerator data.

Operation 404 can also include heating the characterized dielectric 104 to a known or "reference" temperature. Such heating can be useful in detecting minor temperature variations, or in "normalizing" the temperature of characterized dielectric 104 for compatibility with leakage measurement circuit 106. Once heat is received from electronic devices by the characterized dielectric, the method 400 moves to operation 406.

Operation 406 generally refers to measuring leakage current flowing through the characterized dielectric 104, FIG. 1 and converting, with leakage measurement circuit 106, FIG. 1, the leakage current measurement to an output voltage at temperature output 110. According to embodiments, leakage current leakage $I_L$ flows through the temperature-dependent resistance $R_L$ of characterized dielectric 104, FIG. 1, producing a temperature-dependent voltage on sense net 112, FIG. 1. This voltage is received by amplifier 114 of leakage measurement circuit 106, FIG. 1. According to embodiments, amplifier 114 can be an operational amplifier (op-amp) configured to amplify a voltage received on sense net 112 at a positive "+" input.

Amplifier 114, FIG. 1 is configured, with electrically interconnected resistors R2 and R3, to convert the leakage current measurement into an output voltage Vs on the temperature output 110. According to embodiments, the gain of amplifier 114 can be determined by the ratio of values of resistor R2 and resistor R3. Once the leakage current has been measured and converted to an output voltage, the method 400 moves to operation 408.

Operation 408 generally refers to comparing, with response device 120, the output voltage at temperature output 110 to one or more voltage threshold(s). According to embodiments, the output voltage Vs on the temperature output 110 represents and corresponds to the temperature of characterized dielectric 104, FIG. 1.

Response device 120 is electrically interconnected to receive the output voltage Vs on the temperature output 110. According to embodiments, response device 120 can be, for example, a processor circuit, a service processor, a network-connected device, or other electronic device. Response device 120 includes circuits/functionality to receive output voltage Vs, compare Vs to predetermined voltage thresholds (s) and, in response to Vs violating a threshold, initiate one or more responsive action(s).

In some embodiments, output voltage Vs is compared to a high-voltage threshold, i.e., a "maximum" threshold corresponding to a maximum temperature measured with characterized dielectric 104. By way of example, a "maximum" voltage threshold could be 1.1 V, which could correspond to a maximum operating temperature of 130° C. for PCB 158, FIG. 1. A temperature of 130° C. can correspond to a laminate Tg for an PCB constructed using FR4 laminate materials. Operating a PCB 158 above 130° C. can result in irreversible damage, such as delamination, change of state, outgassing, and the like. Other temperature thresholds can correspond to laminate ignition temperature(s) and dielectric discoloration temperature(s), for example.

Other types of dielectric materials can have other corresponding maximum operating temperatures, which can be stored within response device 120 and used as a basis for comparison. In some embodiments, output voltage Vs can be compared to a low-voltage threshold, i.e., a "minimum" threshold corresponding to a minimum temperature measured with characterized dielectric 104. Such a low-voltage threshold can correspond to a minimum operating temperature for PCB 158, FIG. 1.

It can be understood that both high-voltage thresholds and low-voltage thresholds can be used to detect unauthorized tampering activities with electronic equipment, for example equipment incorporating security perimeters and/or other hardware security devices. In some embodiments, these thresholds can be in accordance with temperature thresholds specified by a published cryptosecurity specification. For example, such a cryptosecurity specification can be the *U.S. Government Federal Information Processing Standard* (*FIPS*) 140-2 *Security Requirements for Cryptographic Modules*. Once the output voltage has been compared to the voltage threshold(s), the method 400 moves to operation 410.

At operation 410, a determination is made by the response device 120, FIG. 1, regarding whether the output voltage driven onto temperature output 110, violates at least one voltage threshold. According to embodiments, response device 120 can compare the value of output voltage Vs received at temperature output 110 to one or more internally stored thresholds. One or more of each high-voltage and low-voltage thresholds can be stored within response device 120 and used as a basis for comparison to output voltage output voltage Vs. It can be understood that each voltage threshold corresponds to a particular temperature of characterized dielectric 104. A "violation" of a voltage threshold can be understood to include a value of output voltage Vs that is greater than a high-voltage threshold or a value of output voltage Vs that is less than a low-voltage threshold. By way of example, a value of output voltage Vs that is greater than a high-voltage threshold can corresponding to a temperature of PCB 158 that presents a risk of irreversible damage. If the output voltage driven onto temperature output 110 does not violate at least one voltage threshold, the method 400 returns to operation 404. If the output voltage driven onto temperature output 110 violates at least one voltage threshold, the method 400 moves to operation 412.

Operation 412 generally refers to initiating, with the response device 120, FIG. 1, in response to at least one voltage threshold being violated, an action. According to embodiments, response device 120 can perform an action, or can communicate with another device, e.g., a computer, processor, IC, or network-connected or other electrically interconnected device to initiate the action. Actions can be initiated in response to the violation of one or more high-voltage or low-voltage thresholds. Actions can include sending a message, such as an email notification, sending an SMS notification. According to embodiments, actions can also include triggering an alarm, for example, illuminating an indictor and sounding an audible alarm device.

By way of example, actions corresponding to the violation of a high-voltage threshold can include, but are not limited to, reducing a clock frequency of a heat-producing electronic component within the electronic system 102, reducing power supplied to the electronic system 102, increasing cooling of the electronic system 102 and disconnecting power from the electronic system 102. Similarly, in some embodiments, actions corresponding to the violation of a low-voltage threshold can include, but are not limited to sending a message, such as an email notification, sending an SMS notification or triggering an alarm, such as a visual indictor or audible alarm.

In some embodiments, the action can include deleting encryption keys within a cryptography module, sending an email notification, sending an SMS notification or illuminating an indictor and sounding an audible alarm. Some embodiments of the present disclosure can allow for detection and reaction to attempted, unauthorized inspections of a cryptographic module or device. Embodiments of the present disclosure can provide an indication of an attempted physically intrusive inspection of a secure or cryptographic circuit without imposing permanent and/or negative effects on the functionality of the device or circuit in which it is deployed.

It can be understood that response device 120 can be configured to respond to violations of multiple thresholds with different and unique action to each threshold violation. A non-limiting listing of action types has been provided and described above, however, other types are possible. Once the action has been initiated, the method 400 returns to operation 404.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. An electronic system for temperature monitoring, the system comprising:
 a characterized dielectric located adjacent to a plurality of heat-producing electronic devices, wherein the characterized dielectric comprises a dielectric layer, a first conductive layer, and a second conductive layer of a printed circuit;
 a leakage measurement circuit, electrically connected to the characterized dielectric and configured to:
  measure current leakage through the characterized dielectric; and
  convert a leakage current measurement into a corresponding output voltage; and
 a response device, electrically connected to the leakage measurement circuit and configured to, in response to the output voltage exceeding a voltage threshold corresponding to a known temperature, initiate an action.

2. The electronic system of claim 1, wherein the pinted circuit is a printed circuit board (PCB), a first face of the dielectric layer adjacent to the first conductive layer of the PCB and an opposing face of the dielectric layer adjacent to the second conductive layer of the PCB.

3. The electronic system of claim 1, wherein the printed circuit is a flexible circuit, a first face of the dielectric layer adjacent to the first conductive layer of the flexible circuit and an opposing face of the dielectric layer adjacent to the second conductive layer of the flexible circuit.

4. The electronic system of claim 1, wherein the dielectric layer is selected from the group consisting of: a Fire Retardant (FR) laminate materials layer, a High Temperature (HT) laminate materials layer and an Adhesive-less/high-Performance (AP) laminate materials layer.

5. A method for operating an electronic system for temperature monitoring, the method comprising:
 receiving, with a characterized dielectric, heat from adjacent heat-producing electronic devices, wherein the characterized dielectric comprises a dielectric layer, a first conductive layer, and a second conductive layer of a printed circuit;
 measuring, with a leakage measurement circuit, current leakage through the characterized dielectric;
 converting, with the leakage measurement circuit, measured current leakage into a corresponding output voltage;
 comparing, with a response device electrically interconnected to the leakage measurement circuit, the corresponding output voltage to a high-voltage threshold to detect a characterized dielectric temperature greater than a high-temperature threshold; and
 initiating, in response to the temperature of the characterized dielectric exceeding the high-temperature threshold, an action with the response device.

6. The method of claim 5, wherein the action is selected from the group consisting of: reducing a clock frequency of a heat-producing electronic component within the electronic system, reducing power supplied to the electronic system, increasing cooling of the electronic system and disconnecting power from the electronic system.

7. The method of claim 5, further comprising heating the leakage measurement circuit to a reference temperature.

8. The method of claim 5, wherein the high-temperature threshold corresponds to a temperature selected from the group consisting of: a laminate glass transition temperature ($T_g$), a dielectric discoloration temperature and a laminate ignition temperature.

9. The method of claim 5, wherein:
the comparing includes comparing, with the response device, the corresponding output voltage to a low-voltage threshold to detect a characterized dielectric temperature less than a low-temperature threshold and wherein the method further comprises;
initiating, with the response device, an action in response to the temperature of the characterized dielectric falling below the low-temperature threshold.

10. The method of claim 9, wherein at least one of the high-temperature threshold and the low-temperature threshold are in accordance with temperature thresholds specified by a published cryptosecurity specification.

11. The method of claim 10, wherein the action is selected from the group consisting of: deleting encryption keys within a cryptography module, sending an email notification, sending a Short Messaging Service (SMS) notification, and illuminating an indictor and sounding an audible alarm.

12. The method of claim 5, wherein:
the electronic system is a cryptography security system that includes a cryptography module; and
the response device is selected from the group consisting of: a processor circuit, a service processor and a network-connected device.

\* \* \* \* \*